United States Patent
Guimaraes et al.

(10) Patent No.: US 9,729,126 B2
(45) Date of Patent: Aug. 8, 2017

(54) METHOD AND IMPLEMENTATION FOR ACCURATE GAIN-BANDWIDTH PRODUCT TUNING

(71) Applicant: Futurewei Technologies, Inc., Plano, TX (US)

(72) Inventors: Homero Luz Guimaraes, Schaumburg, IL (US); Matthew Richard Miller, Arlington Heights, IL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/925,799

(22) Filed: Oct. 28, 2015

(65) Prior Publication Data

US 2017/0126207 A1 May 4, 2017

(51) Int. Cl.
 H03F 3/04 (2006.01)
 G06G 7/12 (2006.01)
 H03H 11/12 (2006.01)
 H03F 3/193 (2006.01)
 H03F 1/02 (2006.01)
 H03F 3/45 (2006.01)

(52) U.S. Cl.
 CPC ......... *H03H 11/126* (2013.01); *H03F 1/0205* (2013.01); *H03F 3/193* (2013.01); *H03F 3/45179* (2013.01); *H03F 2200/451* (2013.01); *H03F 2203/45154* (2013.01)

(58) Field of Classification Search
 CPC ........ H03F 3/14; H03F 3/45188; H03F 3/193; H03F 3/45076; H03F 1/0205; H03F 2200/451; H03F 2203/45154; H03H 11/126
 USPC .......................... 327/352–359, 362–364, 588
 See application file for complete search history.

(56) References Cited

U.S. PATENT DOCUMENTS

| 5,497,122 A * | 3/1996 | Somayajula ........ H03F 3/45192 330/253 |
| 6,670,846 B2 * | 12/2003 | Yamamoto ......... H03H 11/1291 327/553 |
| 7,079,646 B2 * | 7/2006 | Chaplik ............... H04M 11/062 379/390.02 |
| 7,994,870 B2 * | 8/2011 | Wang .................. H03H 11/1256 331/172 |

* cited by examiner

Primary Examiner — Dinh T Le
(74) Attorney, Agent, or Firm — Slater Matsil, LLP

(57) ABSTRACT

Method and implementation of gain-bandwidth product (GWB) tuning are disclosed. In an embodiment an operational amplifier (opamp) includes an input stage of the opamp including a differential device pair coupled to a tail device and configured to be responsive to a differential input signal for conducting a first current and an output stage of the opamp including a class AB interface stage circuit and a pair of output devices connected to the class AB interface stage circuit, wherein a first constant gm bias circuit is coupled to an input terminal of the class AB interface stage circuit.

19 Claims, 5 Drawing Sheets

US 9,729,126 B2

METHOD AND IMPLEMENTATION FOR ACCURATE GAIN-BANDWIDTH PRODUCT TUNING

TECHNICAL FIELD

The present invention relates generally to a system and method for accurate gain bandwidth product tuning, and, in particular embodiments, to a system and method for gain bandwidth tuning for a multi-mode baseband filter and a class AB type amplifier.

BACKGROUND

The gain-bandwidth product (GBW) for an amplifier is the product of the amplifier's bandwidth and the gain at which the bandwidth is measured. A class AB type amplifier is defined as an amplifier that conducts through more than a half cycle but less than a full cycle, and normally is implemented by a push pull output transistor pair.

SUMMARY

In accordance with an embodiment an operational amplifier (opamp) comprises an input stage of the opamp including a differential device pair coupled to a tail device and configured to be responsive to a differential input signal for conducting a first current and an output stage of the opamp including a class AB interface stage circuit and a pair of output devices connected to the class AB interface stage circuit, wherein a first constant transconductance bias circuit is coupled to an input of the class AB interface stage circuit.

In accordance with an embodiment a filter includes a first order section and a second order section, wherein the second order section comprises an operational amplifier (opamp), wherein the operational amplifier comprises an input stage of the opamp including a differential device pair coupled to a tail device and configured to be responsive to a differential input signal for conducting a first current and an output stage of the opamp including a class AB interface stage circuit and a pair of output devices connected to the class AB interface stage circuit, wherein a first constant transconductance bias circuit is coupled to an input of the class AB interface stage circuit.

In accordance with an embodiment a method for operating an operational amplifier comprising an input stage including a differential device pair coupled to a tail device and configured to be responsive to a differential input signal for conducting a first current and output stages of the opamp including class AB interface stage circuits and a pair of output devices connected to the class AB interface stage circuits, the method comprising supplying a first bias signal to inputs of the class AB interface stage circuits such that the output devices provide substantially constant transconductances.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
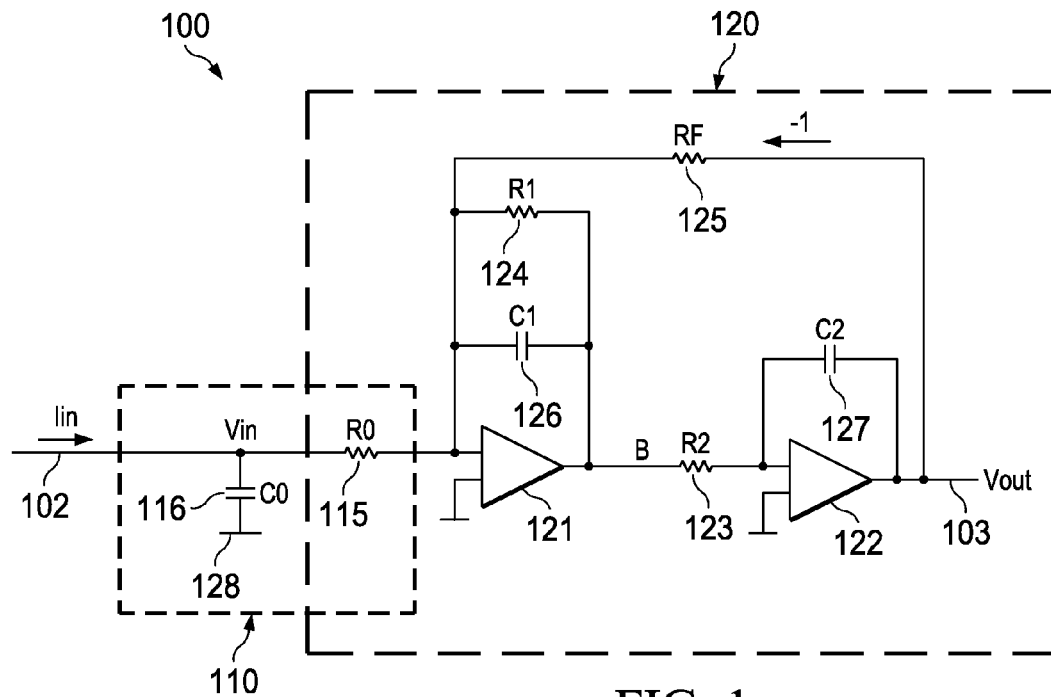
FIG. 1 is a schematic diagram of a low pass filter according to an embodiment.

DETAILED DESCRIPTION OF ILLUSTRATIVE EMBODIMENTS 3G and 4G cellular transceivers may implement several wireless standards (e.g., GSM, LTE, WCDMA, LTE-A, etc.) on the same chip. Each of these standards requires a baseband filter with bandwidth requirements ranging from 200 kHz (GSM) to 20 MHz (LTE-40). This large range of bandwidths poses a problem for the design of the filter.

In order to provide a proper frequency response operational amplifiers (opamps) arranged in the filter need to have a large unity gain-bandwidth product (GBW) relative to the bandwidth of the filter. Moreover, each opamp should have a near constant GBW (since the poles/zeros of the filter will depend on the GBW of the opamps) over a wide variety of processes and temperatures.

In conventional implementations a 200 kHz bandwidth filter needs an opamp with roughly 100 times the gain bandwidth of 200 kHz (e.g., roughly 20 MHz) in order to get an accurate frequency response. What is doable for a 200 kHz filter becomes increasingly difficult to achieve for higher bandwidth filters such as a 20 MHz bandwidth filter. In conventional implementations resistors and capacitors around the opamp(s) have been tuned so that the filter provides the desired response.

The narrower the bandwidth of the opamp compared to the bandwidth of the filter, the higher the impact of variation of the opamp bandwidth on the frequency response of the filter. Accordingly, process (variation in process) and environment (such as variations in temperature or voltage supply) may have a much greater impact on the frequency response of the filter compared to conventional approaches that obey the factor 100 rule of thumb.

Embodiments of the invention provide a stable gain bandwidth product for an opamp in the presence of process and environmental variations without adjusting components such as capacitors and resistors for recalibrating the filter. Embodiments of the invention provide a constant transconductance often called a constant gm bias current to an output stage of the opamp. Embodiments of the invention provide a constant gm bias voltage to an input stage of the opamp. In some embodiments the constant gm bias current is supplied to a class AB interface stage while the constant gm bias voltage is applied to a tail device of the input stage.

The GBW of the opamp is dominated by the transconductance or "gm" of the input stage and the output stage. The goal is that the bias currents of the input stage and the output stage vary with process and temperature such that the transconductances of the input stage and the output stage are substantially constant. This can be done by adjusting the current inside the circuit so that the transconductance of the target transistor is proportional or equal to the value 1/R, wherein R is the value of a resistor within a constant gm type biasing circuit. The resistor may be a low temperature coefficient resistor whose resistive value is substantially stable or constant over a wide temperature range.

In various embodiments transistors at the class AB output stage of the opamp are the transistors with high gm and variations of gm of these transistors dominate the variation of GBW of the opamp. In some embodiments the class AB output stage transistor is an NMOS transistor.

In other embodiments a (e.g., one) constant gm PMOS-based bias circuit is configured to bias the tail PMOS transistor (and the input differential pair transistors) and a (e.g., one) constant gm NMOS-based bias circuit is configured to bias the output stage NMOS transistors.

FIG. 1 shows an example of a low pass filter 100. The filter 100 comprises a cascade of a first order section 110 of the filter 100 and a second order section 120 of the filter 100. The first section 110 may be implemented as an RC pole and the second order section 120 may be implemented as a biquad filter. The biquad filter may include a transfer function that is the ratio of two quadratic functions. The biquad filter may be a Tow-Thomas Biquad Filter. The Tow-Thomas Biquad Filter is implemented as a two opamp filter in this particular example. However, the second order section 120 may include only one opamp, three opamps or another desired number of opamps.

The first order section 110 of the filter 100 may comprise an RC pole. For example, the first order section comprises an input resistor $R_0$ 115 and an input capacitance $C_0$ 116. The first order section 110 further comprises input terminal 102 for an and a ground terminal GND 128. The resistors $R_0$ 115 may comprise more than one resistor (such as two serial resistors) and the capacitor $C_0$ 116 may comprise more than two capacitors. Aside from an RC pole, the first order section 110 may itself be implemented as an active first order filter that utilizes an opamp.

The second order section 120 of the filter may include operational amplifiers (op-amps). In particular, FIG. 1 shows a Tow-Thomas low pass biquad filter as a second order section 120. The second order section 120 may include two op-amps (121 and 122). The resistors $R_0$ 115 and $R_2$ 123 may be the input resistors to the op-amps 121 and 122, respectively. The first op-amp 121 may have a resistor $R_1$ 124 and a capacitor $C_1$ 126 in the feedback loop. The capacitor $C_1$ 126 may add a zero into the loop gain of the first op-amp 121. The second op-amp 122 may have a further capacitor $C_2$ 127 in its feedback loop. The resistor $R_3$ 125 may be the feedback resistor for the entire op-amp chain. The second order section 120 includes an output terminal 103 $V_{out}$.

FIG. 1 describes an embodiment of a third order low-pass filter. In other embodiments, depending on the locations of the output terminal 103, the filter 100 may serve as an inverting band-pass filter, inverting low-pass filter or a non-inverting low-pass filter.

In other embodiments other types of amplifiers may be implemented such as fully differential amplifiers (similar to the op-amp, but with two outputs), instrumentation amplifiers (usually built from three op-amps), isolation amplifiers (similar to the instrumentation amplifier, but with tolerance to common-mode voltages that would destroy an ordinary op-amp), or negative feedback amplifiers (usually built from one or more op-amps and a resistive feedback network).

Figure 2:
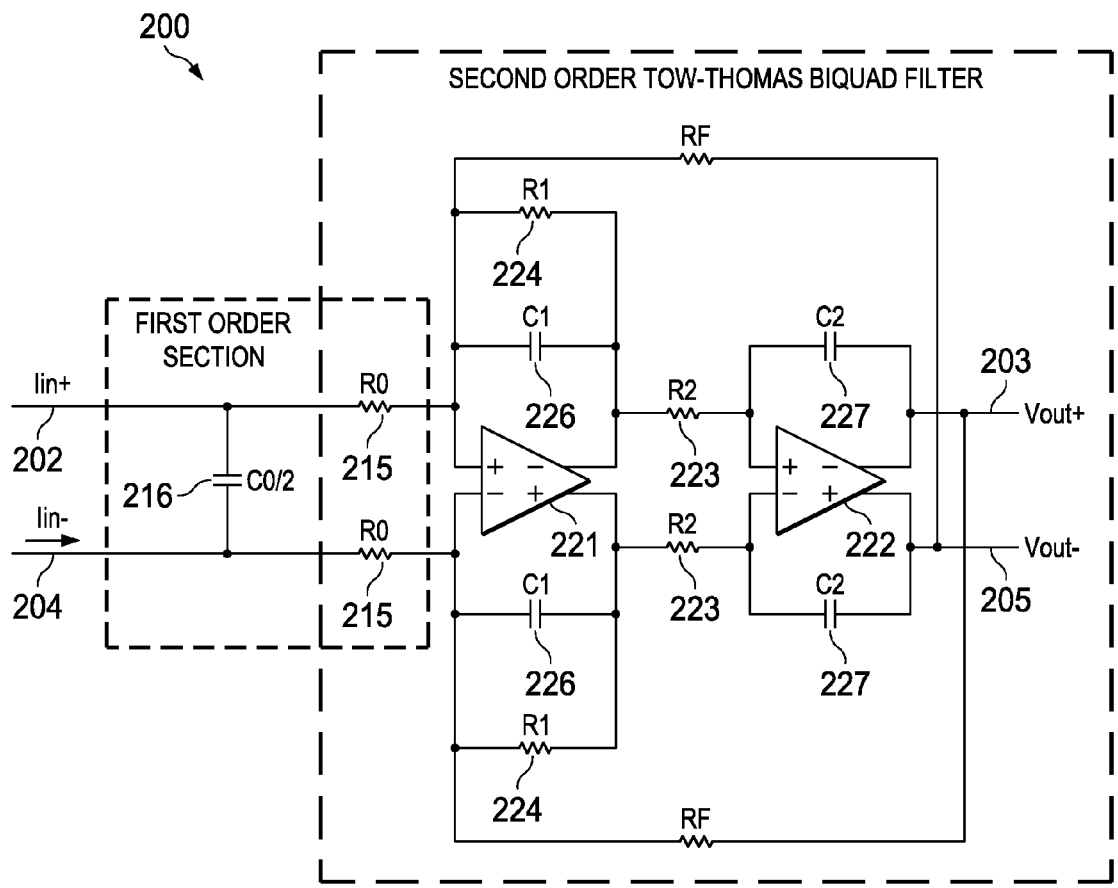
FIG. 2 is a schematic diagram of a low pass filter according to an embodiment.

FIG. 2 shows a third order low pass filter 200 with fully differential amplifiers. The filter of FIG. 2 includes similar elements as the filter of FIG. 1. The first order section 210 of the filter 200 may comprise an RC pole. For example, the first order section 210 comprises an input resistor $R_0$ 215 in each signal path and an input capacitance $C_0/2$ 216. The first order section 210 further comprises two input terminals 202 and 204 for input currents $I_{in+}$ and $I_{in-}$.

The second order section 220 of the filter may include differential amplifiers (differential opamp). In particular, FIG. 2 shows a Tow-Thomas biquad filter as a second order section 220. The second order section 220 may include two differential amplifiers (221 and 222). The resistors $R_0$ 215 and $R_2$ 223 may be the input resistors to the differential amplifiers 221 and 222, respectively. The first differential amplifier 221 may have resistors $R_1$ 224 and a capacitor $C_1$ 226 in the feedback loop. The second differential amplifier 222 may have a further capacitor $C_2$ 227 in its feedback loop. The resistors $R_F$ 225 may be the feedback resistors for the entire differential amplifier chain. The second order section 220 includes two output terminals $V_{out+}$ 203 and $V_{out-}$ 205.

Figure 3:
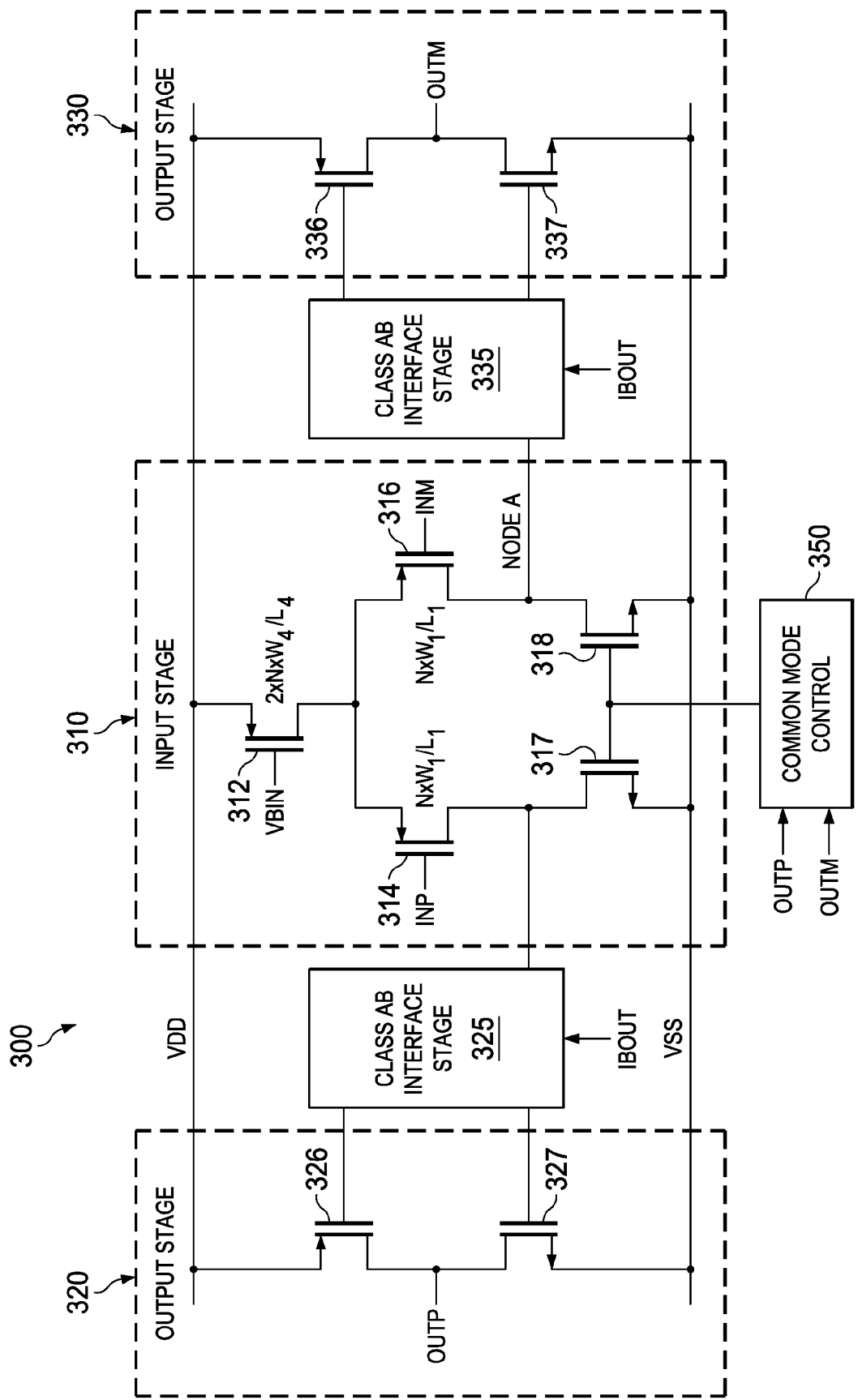
FIG. 3 is a schematic diagram of an opamp according to an embodiment.
Figure 5:
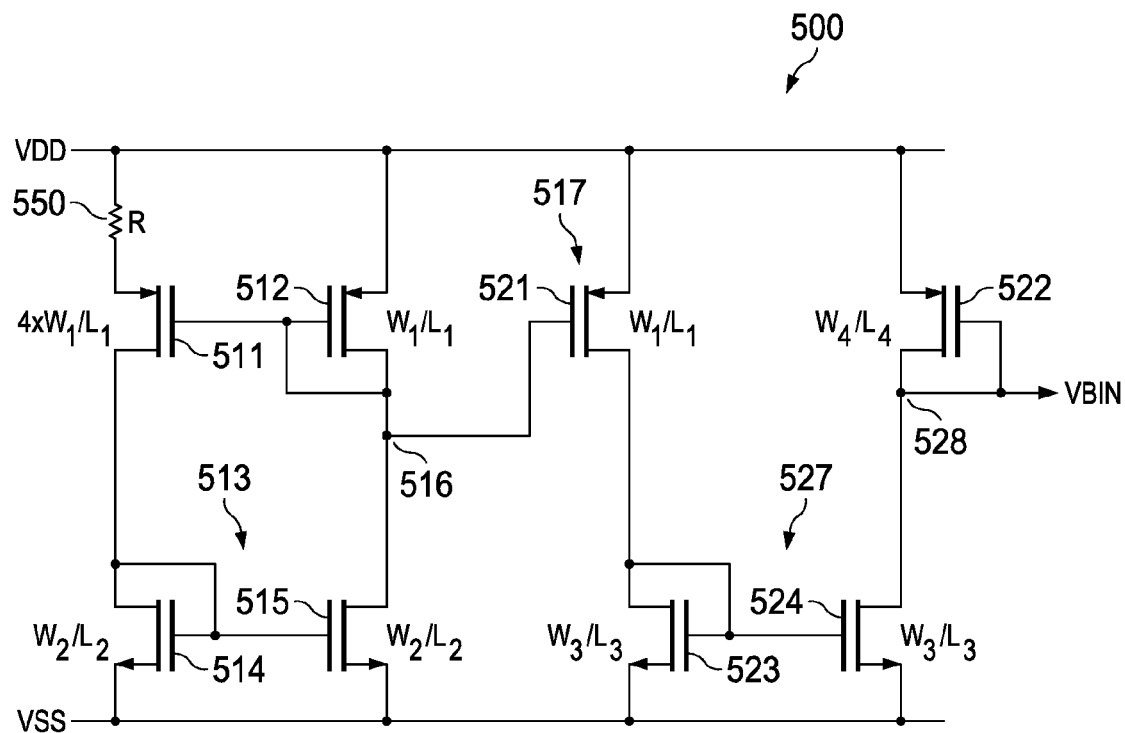
FIG. 5 is a schematic diagram of a PMOS type constant transconductance (gm) bias circuit.

FIG. 3 shows a simplified schematic diagram of a fully differential class AB opamp 300 according to an embodiment. The embodiment of FIG. 3 may be implemented as the opamps 221 and 222 of FIG. 2. The opamp 300 comprises an input stage 310 and two symmetrical output stages 320 and 330. The input stage 310 is communicatively connected to the output stages 320 and 330. The input stage 310 comprises a tail device 312, differential pair devices 314 and 316 and active load devices 317 and 318. The tail device 312 may be a single PMOS transistor. The single PMOS transistor may have a width $W_4$ and a length $L_4$. The gate terminal of the tail device 312 may be configured to receive a first bias input signal (e.g., a voltage, VBIN) to the input stage that results in a constant transconductance (gm) of the input devices 314 and 316. In some embodiments the first bias input signal is provided directly to the gate terminal of the tail device 312 from the output terminal 528 of the bias circuit (FIG. 5). The first bias input signal may be produced by the embodiment of the circuit described and discussed with respect to FIG. 5. The differential pair devices 314 and 316 may also be PMOS transistors. These PMOS transistors may each have a width $W_1$ and a length $L_1$. The gates of the differential input devices are configured to receive the input signals $V_{INP}$ and $V_{INM}$. The load transistors 317 and 318 may be NMOS transistors. The gate terminals of the load transistors 317 and 318 may receive a control signal (feedback signal) based on the output signal of the opamp 300 OUTM and OUTP from the common mode control 350.

The output stages 320 and 330 each comprises a class AB interface stage 325 and 335. Each class AB interface stage 325 and 335 may comprise circuitry described with respect to the embodiment of FIG. 4 and are configured to receive a second bias input signal (e.g., current $I_{BOUT}$) for the output stage. The second bias input signal may produce a constant transconductance (gm) at the devices 327 and 337. The second bias input signal may be produced by the circuit embodiment of FIG. 6. Each of the AB interface stages 325 and 335 may be connected to the output devices 336 and 337, 326 and 327. The output devices 326 and 327 drive the output terminal OUTP and the output devices 336 and 337 drive the output terminal OUTM. The output devices 327 and 337 may be NMOS devices and output devices 326 and 336 may be PMOS transistors.

The transconductance of the input devices 314 and 316 and the transconductances of the output devices 326, 336, 327 and 337 play a major role in determining the gain bandwidth of the opamp 300. By controlling the transconductances of these devices the gain bandwidth of the opamp and therefore the bandwidth and frequency response shape of the filter can be better controlled.

Figure 4:
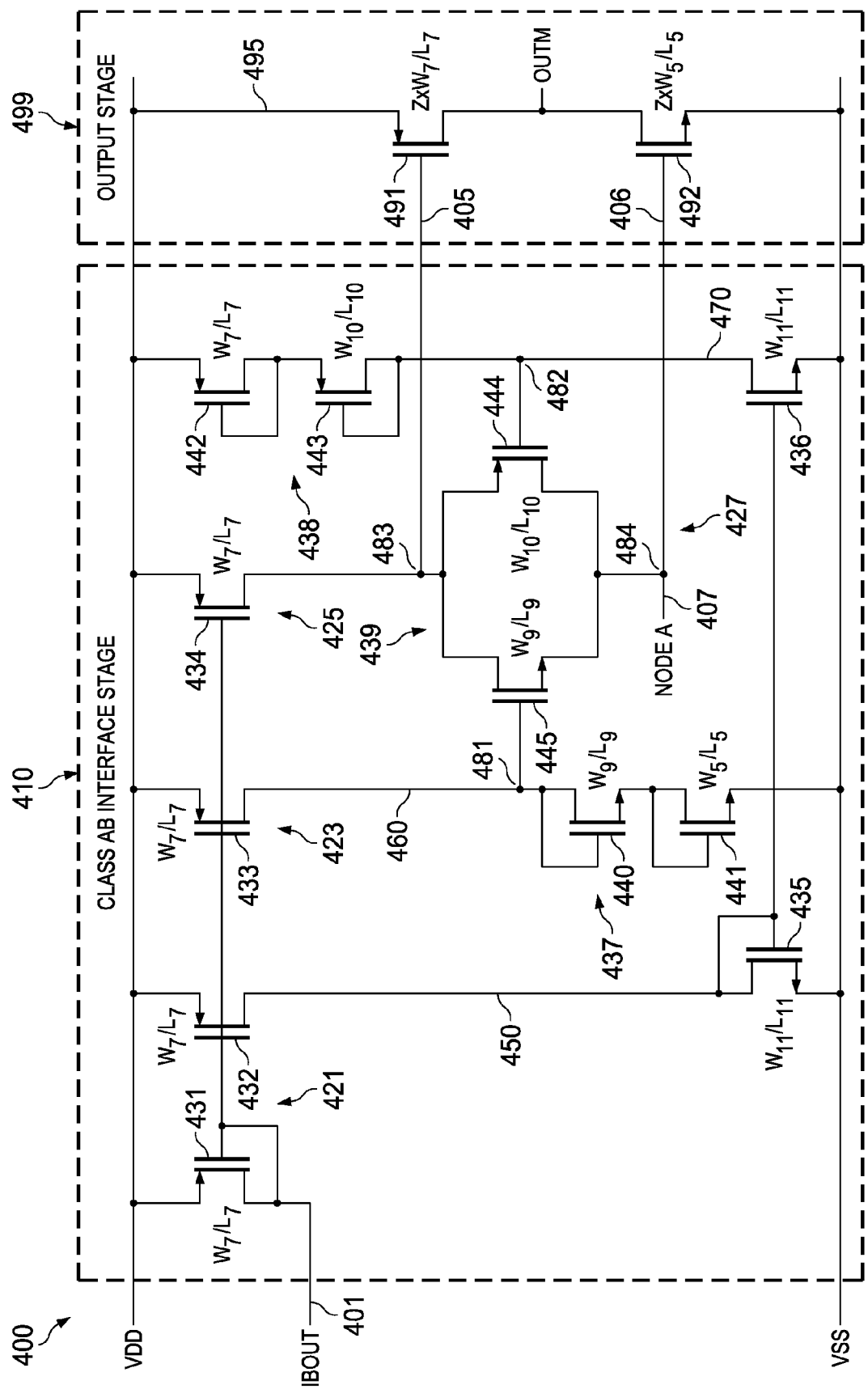
FIG. 4 is a schematic diagram of an intermediate stage of the opamp according to an embodiment.

FIG. 4 shows a schematic diagram of an output stage 400 including a class AB interface stage 410 according to an embodiment. The class AB interface stage 410 has a first input terminal 401 and two output terminals 405 and 406. The class AB interface stage 400 includes also a second input terminal 407 (Node A).

The class AB interface stage 400 comprises a first current mirror 421 comprising devices 431 and 432, a second current mirror 423 comprising device 431 and 433, a third current mirror 425 comprising devices 431 and 434 and a fourth current mirror 427 comprising devices 435 and 436. Devices 432 and 435 are connected in a first branch 450, device 433 and diode connected devices 437 are connected in a second branch 460, and device 436 and diode connected devices 438 are connected in a third branch 470. A first node 481 of the second branch 460 is connected to level shifting device 439. A second node 482 of the third branch 470 is also connected to the level shifting device 439. Moreover, the level shifting device 439 is connected to device 434 via a third node 483 and the level shifting device 439 is connected to node A 407 via a fourth node 484. The third node 483 and the fourth node 484 are connected to the output devices 491 and 492. The diode connected devices 437 include devices 440 and 441 and the diode connected devices 438 include devices 442 and 443. The level shifter 439 includes devices 444 and 445.

The devices 431-434 and 442-444 may include PMOS transistors and devices 435, 436, 440, 441, 445 may include NMOS devices. Devices 431-434 may be PMOS transistors having the same width $W_7$ and the same length $L_7$. Devices 435 and 436 may be NMOS transistors having the same width $W_{11}$ and the same length $L_{11}$. Devices 440 and 445 may be NMOS transistors having the same width $W_9$ and the same length $L_9$, and devices 443 and 444 may be PMOS transistors having the same width $W_{10}$ and same length $L_{10}$. Device 441 may be an NMOS transistor having a width $W_5$ and a length $L_5$ and device 442 may be a PMOS transistor having a width $W_7$ and a length $L_7$.

Output device 491 may be a PMOS device having a width to length ratio of Z times $W_7/L_7$ and output device 492 may have a NMOS device having a width to length ratio of Z times $W_5/L_5$.

Figure 6:
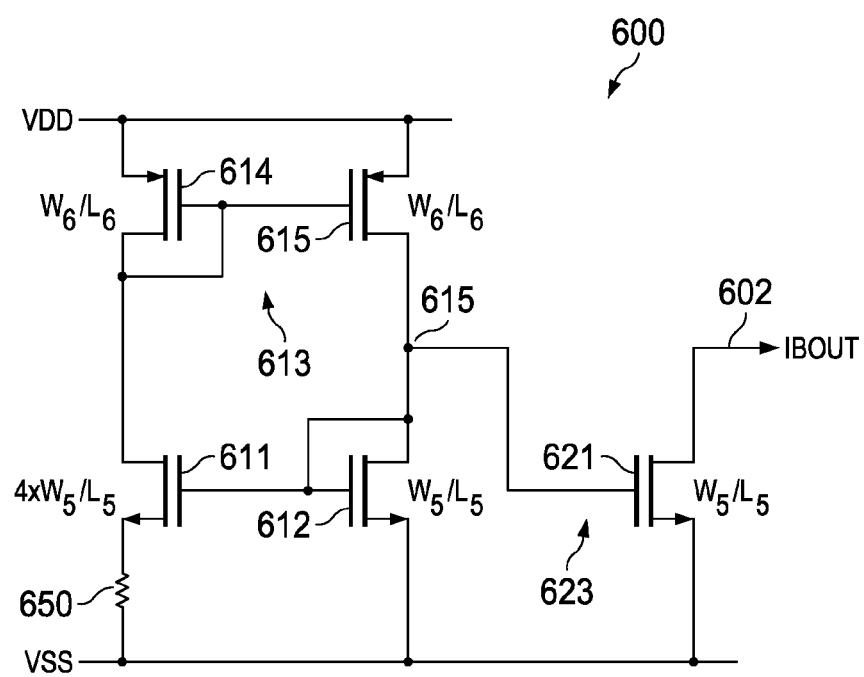
FIG. 6 is a schematic diagram of a NMOS type constant transconductance (gm) bias circuit.

In operation a bias input signal (e.g., supply current IBOUT) is provided at or supplied to the input terminal 401 and is mirrored via the current mirrors 421, 423 and 425 to the branches 450, 460 and 470. In some embodiment the bias input signal is provided directly to the input terminal 401 from the output terminal 602 of the bias circuit as shown in FIG. 6. The current mirror 427 mirrors a current (e.g., IBOUT) signal from branch 450 to branch 470. The diode connected devices 437 establishes a potential of $V_{gs441}$ plus $V_{gs\ 440}$ at the first node 481. Since the device 440 is the same relative dimension as the device 445 the level shifter 439 establishes a potential of $V_{gs441}$ at the fourth node 484. Similarly, the diode connected devices 438 establish a potential of $V_{gs442}$ plus $V_{gs443}$ at the second node 482. Since the device 444 is the same relative dimension as the device 443 the level shifter 439 establishes a potential of $V_{gs442}$ at the third node 483. The potential $V_{gs442}$ drops between the source and gate of device 491 and potential $V_{gs441}$ drops between the source and gate of device 492. The current in the output branch 495 may be Z times the supply current IBOUT.

FIG. 5 shows a schematic diagram of a constant transconductance bias circuit for the input stage. The constant transconductance bias circuit may produce a transconductance (gm) bias input signal that produces a constant transconductance at the input devices (e.g., 314 and 316). For example, the transconductances of the input devices 314 and 316 may be between 0.5 millisiemens and 2 millisiemens, or alternatively, between 1 millisiemens and 1.5 millisiemens. The transconductances at the device 314 and 316 are substantially constant. Substantially constant may mean within an error of +/−5% or +/−3%. In some embodiments the input signal is not constant (e.g., $V_{BIN}$ is not constant) but the transconductance at the devices 314 and 316 is constant. The transconductance is constant over a temperature variation of −50 degrees Celsius to 150 degrees Celsius, or alternatively, over a temperature variation of −30 degrees Celsius to 110 degrees Celsius. In some embodiments, the transconductance is stable over a temperature variation of −10 degrees Celsius to 100 degrees Celsius.

The bias circuit may be a PMOS type constant gm bias circuit. It generates a bias voltage VBIN that is used to set the current of the opamp input stage tail device. The circuit 500 comprises a low temperature coefficient (TC) high stability resistor R 550 such as a zero-TC high stability resistor. The TC resistor R 550 may comprise a nearly constant resistance over a temperature range of about −30 degrees Celsius to about 125 degrees Celsius. In other embodiments the TC resistor is stable over other temperature ranges (see above). The resistor R 550 is connected to the source of device 511 and to VDD. The gate of device 511 is connected to the gate of device 512. The source of device 512 is also connected to VDD. The devices 511 and 512 are connected to current mirror 513 (with devices 514 and 515). The source terminal of the devices 514 and 515 are connected to VSS. Devices 512 and 521 form the second current mirror 517 and devices 523 and 524 form the third current mirror 527. The devices 511, 512, 521 and 522 may be PMOS transistors and the devices 514, 515, 523 and 524 may be NMOS transistors.

Devices 511 and 512 and the resistor R 550 form the $\Delta V_{gs}$ current generating portion. With proper (relative) sizing of devices 511 and 512, the action of this portion of the circuit is to provide a bias voltage at the gate of device 512 and a corresponding bias current through device 512 that produces a substantially constant transconductance characteristic for device 512 independent of device variation from part to part, variation of the power supply, or variation of temperature. In turn, transistor devices elsewhere on the same integrated circuit that are sized similarly to device 512 and provided with similar bias current will also possess similar transconductance (e.g., device 521). Furthermore, transistor devices elsewhere on the same integrated circuit that are scaled in size with respect to device 512 in terms of width to length ratio, but have the same gate to source voltage as device 512 (e.g., devices 314 and 316), may have a similarly scaled transconductance characteristic.

Devices 511, 512 and 521 may be PMOS transistors having the same length $L_1$. Devices 512 and 521 may also have the same width $W_1$. However, the width of the device 511 may be four times larger than those of the devices 512 and 521. Devices 514 and 515 may be NMOS transistors having the same width $W_2$ and the same length $L_2$. Devices 523 and 524 may be NMOS transistors having the same width $W_3$ and the same length $L_3$.

Device 522 may be a PMOS transistor having a width $W_4$ and a length $L_4$. Tail device 312 in FIG. 3 may also be a PMOS transistor having a width $W_4$ and a length $L_4$. However, tail device may be a 2 times N wider device than device 522.

In operation the bias circuit 500 provides a bias voltage VBIN. The bias voltage VBIN is used to set the bias current of the tail device 312 in the input stage of the opamp of FIG. 3. In turn, this current must also pass through the input devices 314 and 316 of the opamp. Because this current is a scaled replica of the current passing through device 512 (in FIG. 5), and the opamp input devices 314 and 316 are similarly scaled with respect to device 512, the transconductance of the opamp input devices is rendered substantially constant despite processing and environment variations.

FIG. 6 shows a schematic diagram of a constant transconductance bias circuit for the output stage. The constant transconductance bias circuit may produce a transconductance (gm) bias signal that produces a constant transconductance at the input devices (e.g., 314 and 316). For example, the transconductances of the output devices 327/492 and 337/492 may be between 2 millisiemens and 15 millisiemens, or alternatively, between 5 millisiemens and 10 millisiemens. The transconductances at the devices 327/492 and 337/492 are substantially constant. Substantially constant may mean within an error of +/−5% or +/−3%. In some embodiments the input signal is not constant (e.g. $I_{BOUT}$ is not constant) but the transconductance at the devices 327/492 and 337/492 is constant. The transconductance is constant over a temperature variation of −50 degrees Celsius to 150 degrees Celsius, or alternatively, over a temperature variation of −30 degrees Celsius to 110 degrees Celsius. In some embodiments, the transconductance is stable over a temperature variation of −10 degrees Celsius to 100 degrees Celsius.

The circuit 600 comprises a low temperature coefficient (TC) high stability resistor R 650 such as a zero-TC high stability resistor. The TC resistor R 650 may comprise a nearly constant resistance over a temperature range of about −30 degrees to about 125 degrees Celsius. In other embodiments the TC resistor is stable over other temperature ranges (see above). The resistor R 650 is connected to the source terminal of device 611 and to VSS. The gate terminal of device 611 is connected to the gate terminal of device 612. The source terminal of device 612 is also connected to VSS. The devices 611 and 612 are connected to current mirror 613 comprising devices 614 and 615. The source terminals of the devices 614 and 615 are connected to VDD. Devices 612 and 621 form the second current mirror 623. The drain terminal of the device 621 is configured to supply the constant gm bias signal (e.g., output current IBOUT) to the output terminal 602.

Devices 611, 612 and 621 may be NMOS devices and the devices 614 and 615 may be PMOS devices. Devices 611 and 612 and the resistor R 650 form the $\Delta V_{gs}$ current generating portion. With proper relative sizing of devices 611 and 612, the action of this portion of the circuit 600 is to provide a bias voltage at the gate of device 612 and a corresponding bias current through device 612 that produces a substantially constant transconductance characteristic for device 612 independent of device variation from part to part, variation of the power supply, or variation of temperature. In turn, transistor devices elsewhere on the same integrated circuit (e.g., device 621) that are sized similarly to device 612 and provided with similar bias current will also possess similar transconductance. Furthermore, transistor devices elsewhere on the same integrated circuit that are scaled in size with respect to device 612 in terms of width to length ratio (e.g., devices 327/492 and 337/492), but have the same gate to source voltage as device 612, will have a similarly scaled transconductance characteristic.

Devices 611, 612 and 621 may be NMOS transistors having the sane width $W_5$ and same length $L_5$. However, device 611 may have 4 times the width than devices 612 and 623. Devices 614 and 615 may be PMOS transistors having the same width $W_6$ and the same length $L_6$.

In operation the bias circuit 600 supplies a bias current. The resistor 650 and the devices 611 and 612 establish a constant gm bias voltage $\Delta V_{gs}$ at bias point 615. The output current IBOUT is generated by the current mirror 613 and mirrored via the current mirror 623 to the output terminal 602 of the bias circuit 600. This bias current is provided to the class AB interface stage 400 described earlier and illustrated in FIG. 4. As mentioned earlier, the class AB interface stage produces a scaled replica of this current to bias the NMOS device 492 in the opamp output stage. Because device 492 is similarly scaled with respect to device 612 (in FIG. 6), it possesses a similarly scaled transconductance as compared to device 612. As a result, the transconductance of the opamp NMOS output device is rendered substantially constant despite processing and environment variations.

Figure 7:
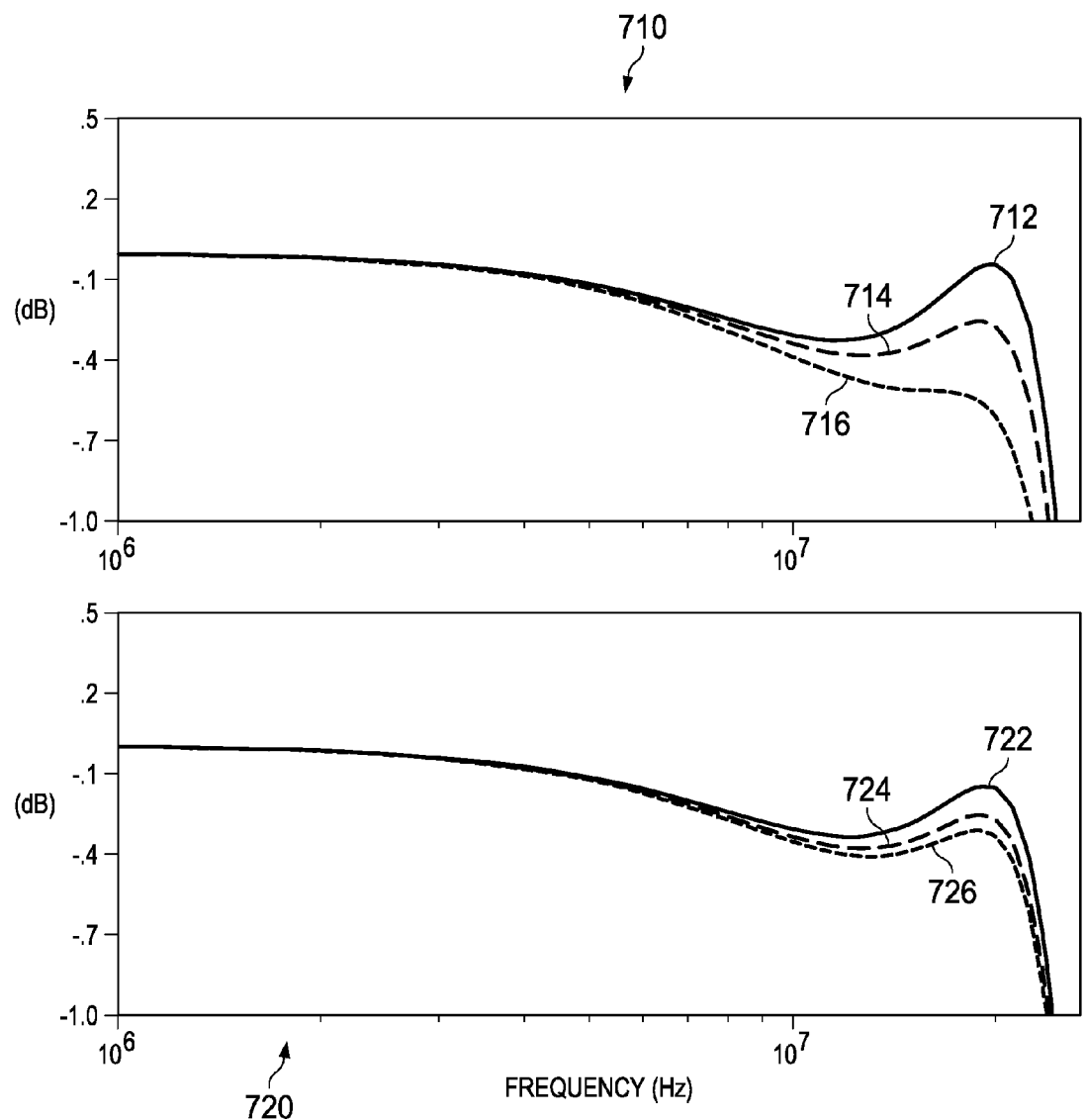
FIG. 7 is a plot diagram showing simulated frequency response plots for a 20 MHz low pass filter when performed for a variety of temperatures.

FIG. 7 illustrates a plot diagram showing simulated frequency response plots for a 20 MHz low pass filter when performed for a variety of temperatures. The opamp gain bandwidth is around 400 MHz for these simulations. As can be seen the frequency response peak near the band edge is within a tight range over temperature.

The simulation was performed for temperatures of −30 degrees Celsius, 50 degrees Celsius and 110 degrees Celsius. The upper plot 710 is the frequency response with opamps using constant current biases and the lower plot 720 is the frequency response with opamps using constant transconductance biasing (e.g., but not necessarily constant current biases). Curve 712 is the curve for 110 degrees Celsius, curve 714 is the curve for 55 degree Celsius, and curve 716 is the curve for −30 degree Celsius. Similarly, curve 722 is the curve for 110 degrees Celsius, curve 724 is the curve for 55 degree Celsius, and curve 726 is the curve for −30 degree Celsius. The curves 712-716 and 722-726 in each plot 710 and 720 should be as close together as possible. As can be seen, for lower frequencies (e.g., f=below $10^7$ Hz) this is achieved for constant transconductance biasing as well as for constant current biasing. However, for frequencies above $10^7$ Hz the opamps operating with constant transconductance biasing are far superior than opamps operated with constant current biases. The improvement is about a factor 2 in dB in this embodiment.

In embodiments the 10-30 MHz low pass filters may be operated within a dB range for temperatures between −30 degrees Celsius and 110 degrees Celsius. As mentioned earlier, the accuracy of the filter frequency response is affected by the unity gain bandwidth of the opamp and the variation of that unity gain bandwidth. Using constant transconductance biasing for the opamps enables higher accuracy of the frequency response to be obtained, or alternatively can allow a relaxation in the gain bandwidth of the opamps required to obtain a target accuracy. In low pass filters where the opamp unity gain bandwidth is about 10-40 times, about 20-30 times, about more than 20 times or about 20 times the filter bandwidth, frequency response characteristics within 0.25 dB, 0.5 dB, or 0.75 dB of the intended frequency response shape may be attained over temperature ranges of −30 degrees Celsius to 110 degrees Celsius.

In some embodiments a constant gm bias circuit is implemented only at the output stage but not at the input stage thereby providing only the output stage with constant gm biasing.

In various embodiments the PMOS devices are replaced with NMOS devices and the NMOS devices are replaced with PMOS devices. For such configurations other minor changes may be made.

In some embodiments the filter chip is a chip that is produced according to CMOS technology. The filter chip may comprise a single integrated circuit. The filter chip may be implemented in a base station (such as eNB) or in user equipment or devices (such as mobile phones, smart phones, tablet devices, etc.). Instead of a filter chip, a filter component assembled from different chips (integrated circuits) may be used in some embodiments.

In various embodiments the connections between two elements or devices is a direct connection without any elements or devices in between.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An operational amplifier (opamp) comprising:
an input stage of the opamp including a differential device pair coupled to a tail device and configured to be responsive to a differential input signal for conducting a first current;
an output stage of the opamp including a class AB interface stage circuit and a pair of output devices connected to the class AB interface stage circuit; and
a first bias circuit coupled to an input of the class AB interface stage circuit, wherein the first bias circuit is configured to provide a first input signal to the class AB interface stage circuit such that an output device of the pair of output devices comprises a substantially constant transconductance, and wherein the first bias circuit comprises a current generating portion, a first current mirror and a second current mirror.

2. The opamp according to claim 1, wherein the first input signal is an input current IBOUT to the class AB interface stage circuit.

3. The opamp according to claim 1, wherein the current generating portion is a $\Delta V_{gs}$ current generating portion including a resistor, wherein the resistor is connected with a first terminal to VSS and with a second terminal to a source terminal of a first NMOS transistor, wherein a source terminal of a second NMOS transistor is connected to VSS, and wherein a gate terminal of the first NMOS transistor is connected to a gate terminal of the second NMOS transistor.

4. The opamp according to claim 3, wherein the resistor is a low temperature coefficient (TC) high stability resistor.

5. The opamp according to claim 4, wherein the TC high stability resistor has a substantially constant resistance over a temperature range of about −30 degrees Celsius to about 125 degrees Celsius.

6. The opamp according to claim 3, wherein the first current mirror comprises a first PMOS transistor, the first PMOS transistor connected with a source terminal to VDD and with a drain terminal to a drain terminal of the first NMOS transistor, and a second PMOS transistor, the second PMOS transistor connected with a source terminal to VDD and with a drain terminal to a drain terminal of the second NMOS transistor, and wherein a gate terminal of the first PMOS transistor is connected to the gate terminal of the second PMOS transistor.

7. The opamp according to claim 4, wherein the second current mirror comprises the second NMOS transistor and a third NMOS transistor, wherein a source terminal of the third NMOS transistor is connected to VSS and a drain terminal of the third NMOS transistor is connected to an output terminal, the output terminal configured to provide an input current IBOUT to the class AB interface stage circuit.

8. The opamp according to claim 1, further comprising a second bias circuit coupled to a gate of the tail device, wherein the second bias circuit is configured to provide a second input signal such that the differential device pair comprises a substantially constant transconductance.

9. The opamp according to claim 8, wherein the second input signal is an input voltage VBIN provided directly to a gate of the tail device.

10. A filter comprising:
a first order section; and
a second order section, wherein the second order section comprises an operational amplifier (opamp), the opamp comprising:
an input stage of the opamp including a differential device pair coupled to a tail device and configured to be responsive to a differential input signal for conducting a first current;
an output stage of the opamp including a class AB interface stage circuit and a pair of output devices connected to the class AB interface stage circuit; and
a first bias circuit coupled to an input of the class AB interface stage circuit, wherein the first bias circuit is configured to provide a first input signal to the class AB interface stage circuit such that an output device of the pair of output devices comprises a substantially constant transconductance, and wherein the second order section is a Tow-Thomas Biquad Filter.

11. The filter according to claim 10, wherein the first order section is an RC pole.

12. The filter according to claim 10, wherein the Tow-Thomas Biquad Filter comprises two opamps.

13. The filter according to claim 10, further comprising a second bias circuit coupled to a gate of the tail device, wherein the second bias circuit is configured to provide a second input signal such that the differential device pair comprises a substantially constant transconductance.

14. An operational amplifier (opamp) comprising:
an input stage of the opamp including a differential device pair coupled to a tail device and configured to be responsive to a differential input signal for conducting a first current; and
an output stage of the opamp including a class AB interface stage circuit and a pair of output devices connected to the class AB interface stage circuit,
wherein a first substantially constant transconductance bias circuit is coupled to an input of the class AB interface stage circuit, and wherein the first substantially constant transconductance bias circuit comprises a $\Delta V_{gs}$ current generating portion, a first current mirror and a second current mirror.

15. The opamp according to claim 14, wherein the $\Delta V_{gs}$ current generating portion comprises a resistor, wherein the resistor is connected with a first terminal to VSS and with a second terminal to a source terminal of a first NMOS transistor, wherein a source terminal of a second NMOS transistor is connected to VSS, and wherein a gate terminal of the first NMOS transistor is connected to a gate terminal of the second NMOS transistor.

16. The opamp according to claim 15, wherein the resistor is a low temperature coefficient (TC) high stability resistor, and wherein the TC high stability resistor has a substantially constant resistance over a temperature range of about −30 degrees Celsius to about 125 degrees Celsius.

17. The opamp according to claim 15, wherein the first current mirror comprises a first PMOS transistor, the first PMOS transistor connected with a source terminal to VDD and with a drain terminal to a drain terminal of the first NMOS transistor, and a second PMOS transistor, the second PMOS transistor connected with a source terminal to VDD and with a drain terminal to a drain terminal of the second NMOS transistor, and wherein a gate terminal of the first PMOS transistor is connected to the gate terminal of the second PMOS transistor.

18. The opamp according to claim 17, wherein the second current mirror comprises the second NMOS transistor and a third NMOS transistor, wherein a source terminal of the third NMOS transistor is connected to VSS and a drain terminal of the third NMOS transistor is connected to an output terminal, the output terminal configured to provide an input current IBOUT to the class AB interface stage circuit.

19. A filter comprising:
a first order section; and
a second order section, wherein the second order section comprises an operational amplifier (opamp), wherein the opamp comprises:
   an input stage of the opamp including a differential device pair coupled to a tail device and configured to be responsive to a differential input signal for conducting a first current; and
   an output stage of the opamp including a class AB interface stage circuit and a pair of output devices connected to the class AB interface stage circuit,
wherein a first substantially constant transconductance bias circuit is coupled to an input of the class AB interface stage circuit, and
wherein the second order section is a Tow-Thomas Biquad Filter.

* * * * *